United States Patent
Tanaka et al.

(10) Patent No.: US 6,838,340 B2
(45) Date of Patent: Jan. 4, 2005

(54) METHOD OF MANUFACTURING SEMICONDUCTOR DEVICE HAVING MIM CAPACITOR ELEMENT

(75) Inventors: Tomohiro Tanaka, Tokyo (JP); Naofumi Murata, Tokyo (JP); Tohru Koyama, Tokyo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/608,338

(22) Filed: Jun. 30, 2003

(65) Prior Publication Data

US 2004/0171239 A1 Sep. 2, 2004

(30) Foreign Application Priority Data

Feb. 28, 2003 (JP) ........................... 2003-053166

(51) Int. Cl.[7] .......................................... H01L 21/8242
(52) U.S. Cl. ...................... 438/253; 257/306; 438/387; 438/396
(58) Field of Search ................................ 438/243, 244, 438/253–256, 386, 387, 396; 257/307–311, 762, 301, 306, 324, 760

(56) References Cited

U.S. PATENT DOCUMENTS

| | | | |
|---|---|---|---|
| 5,638,103 A | | 6/1997 | Obata et al. |
| 5,983,057 A | | 11/1999 | Matsuo et al. |
| 6,008,083 A | * | 12/1999 | Brabazon et al. ........... 438/239 |
| 6,313,003 B1 | * | 11/2001 | Chen ........................... 438/396 |
| 6,483,142 B1 | * | 11/2002 | Hsue et al. .................. 257/306 |
| 6,759,703 B1 | * | 7/2004 | Matsuhashi .................. 257/306 |
| 2002/0022333 A1 | | 2/2002 | Morand et al. |
| 2003/0178666 A1 | * | 9/2003 | Lee et al. .................... 257/306 |

FOREIGN PATENT DOCUMENTS

| | | |
|---|---|---|
| JP | 1-198061 | 8/1989 |
| JP | 2000-36565 | 2/2000 |
| JP | 2002-100680 | 4/2002 |

* cited by examiner

*Primary Examiner*—Asok Kumar Sarkar
(74) *Attorney, Agent, or Firm*—Oblon, Spivak, McClelland, Maier & Neustadt, P.C.

(57) ABSTRACT

A method of manufacturing a semiconductor device includes forming a first interlayer insulation film on a semiconductor substrate, depositing a first metal film on the first interlayer insulation film, depositing an antireflection film including a dielectric layer on an upper surface of the first metal film, patterning the first metal film and the antireflection film to form a lower electrode having the antireflection film on an upper surface thereof, forming a second interlayer insulation film on the antireflection film, forming first and second openings in a first region and in a second region in the second interlayer insulation film, respectively, removing a portion of the antireflection film where the second opening is formed, depositing a second metal film on the second interlayer insulation film, and removing the second metal film except in the first and second openings to form an upper electrode in the first opening, and a contact in the second opening.

2 Claims, 2 Drawing Sheets

US 6,838,340 B2

METHOD OF MANUFACTURING SEMICONDUCTOR DEVICE HAVING MIM CAPACITOR ELEMENT

BACKGROUND OF THE INVENTION

1. Field of the Invention

The present invention relates to semiconductor device manufacture, and especially to a method of manufacturing a MIM (Metal Insulator Metal) capacitor element.

2. Description of the Background Art

Conventionally, a semiconductor device employs a capacitor element whose upper and lower electrodes are formed of polysilicon. In the process of manufacturing a semiconductor device having such a capacitor element, the upper electrode of the capacitor element is formed of the same layer of polysilicon as the gate electrode of a transistor. However in recent years, in the formation of the gate electrode of the transistor, ions are often implanted into polysilicon which forms the gate electrode. Thus, the upper electrode of the capacitor element is also formed of ion-implanted polysilicon. As a result, depletion occurs in the polysilicon of the upper electrode, which varies the capacitance value of the capacitor element depending on the applied voltage and the temperature. This causes the problem of a malfunction of the semiconductor device.

To solve such a problem, in recent years, a capacitor element having a MIM (Metal Insulator Metal) structure using metal as an electrode has been employed (see, for example, Japanese Patent Application Laid-open No. 1-198061 (1989) (p. 2, FIG. 1)). However, since a conventional MIM capacitor element has its upper and lower electrodes at different levels, it is difficult to form a contact hole on each of the upper and lower electrodes after formation of the MIM capacitor element.

There is also a technique for incorporating a MIM capacitor element into a single layer of insulating film (see, for example, Japanese Patent Application Laid-open No. 2002-100680 (pp. 4–5, FIGS. 3–5)). According to the MIM capacitor element in this publication, the upper and lower electrodes are at the same level.

In the process of forming a MIM capacitor element according to Japanese Patent Application Laid-open No. 2002-100680, however, the lower electrode needs to be formed into a complicated shape, and also relatively high accuracy is required for the depth of a trench for forming the lower electrode and the thickness of a dielectric layer to be deposited. This can complicate the manufacturing process.

For semiconductor devices having a MIM capacitor element, forming through simple processes the MIM capacitor element and contacts to the upper and lower electrodes of the MIM capacitor element is an important issue for simplification of the semiconductor device manufacturing process.

SUMMARY OF THE INVENTION

An object of the present invention is to provide a semiconductor device that is capable of forming, through simple processes, a MIM capacitor element and contacts to the upper and lower electrodes of the MIM capacitor element.

According to the present invention, the method of manufacturing a semiconductor device includes the following steps (a) through (d). The step (a) is to sequentially deposit and pattern a predetermined first metal film and an antireflection film including a dielectric layer on a semiconductor substrate to form a lower electrode having the antireflection film on its upper surface. The step (b) is to form an interlayer insulation film on the lower electrode and forming first and second openings respectively in a capacitor element forming region of and a contact forming region of the interlayer insulation film on the lower electrode. The step (c) is to remove the antireflection film in the second opening. The step (d) is to deposit a predetermined second metal film on the interlayer insulation film having the first and second openings and remove the second metal film other than the second metal film in the first and second openings, to form an upper electrode of the capacitor element in the first opening and a contact in the second opening.

This achieves the effect of forming, through simple processes, the MIM capacitor element and contacts to the upper and lower electrodes of the MIM capacitor element.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
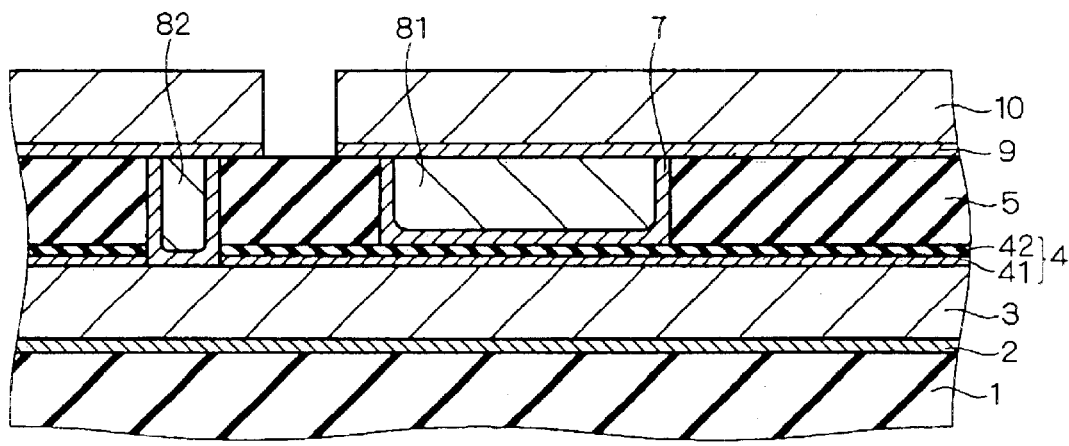
FIG. 1 is a diagram showing the structure of a semiconductor device according to a preferred embodiment.

FIG. 1 is a diagram showing the structure of a semiconductor device according to a preferred embodiment of the present invention. On a first interlayer insulation film 1 formed on a semiconductor substrate, a barrier metal 2 and a first aluminum interconnect line 3 are formed. The first aluminum interconnect line 3 serves as the lower electrode of a MIM capacitor element. An antireflection film 4 on the first aluminum interconnect line 3 is provided for the purpose of preventing dimension variations and halation in the exposure process in the patterning of the first aluminum interconnect line 3. Generally, for an interconnect line of aluminum, a multi-layer antireflection film is used for patterning. In the present preferred embodiment, the antireflection film 4 is composed of a titanium nitride (TiN) layer 41 of conductor and a silicon oxynitride film (SiON) layer 42 of dielectric.

In a second interlayer insulation film 5, a contact plug 82 which is electrically connected to the first aluminum interconnect line 3 is formed, and an upper electrode 81 is formed through the antireflection film 4 on the first aluminum interconnect line 3. That is, the SiON layer 42 of the antireflection film 4 serves as a dielectric layer of the MIM capacitor element.

On the second interlayer insulation film 5, a second aluminum interconnect line 10 having a barrier metal 9 is formed. The second aluminum interconnect line 10 is individually connected to the upper electrode 81 and the contact plug 82 (that is, as shown in FIG. 1, the second aluminum interconnect line 10 includes a portion connected to the upper electrode 81 and a portion connected to the contact plug 82).

Hereinbelow, a method of manufacturing a semiconductor device according to the present preferred embodiment is described. First, after deposition of the barrier metal 2 on the first interlayer insulation film 1, an aluminum film for forming the first aluminum interconnect line 3 is deposited. After the antireflection film 4 composed of the TiN layer 41 and the SiON layer 42 as a dielectric layer is deposited on the aluminum film, the antireflection film 4, the aluminum film and the barrier metal 2 are patterned using photolithographic techniques, to form the first aluminum interconnect line 3 having the antireflection film 4 on its upper surface. In the exposure process at this time, the antireflection film 4 serves to prevent dimension variations of the first aluminum interconnect line 3 and halation. At this time, the antireflection film 4 on the first aluminum interconnect line 3 formed by the patterning is not removed.

Figure 2:
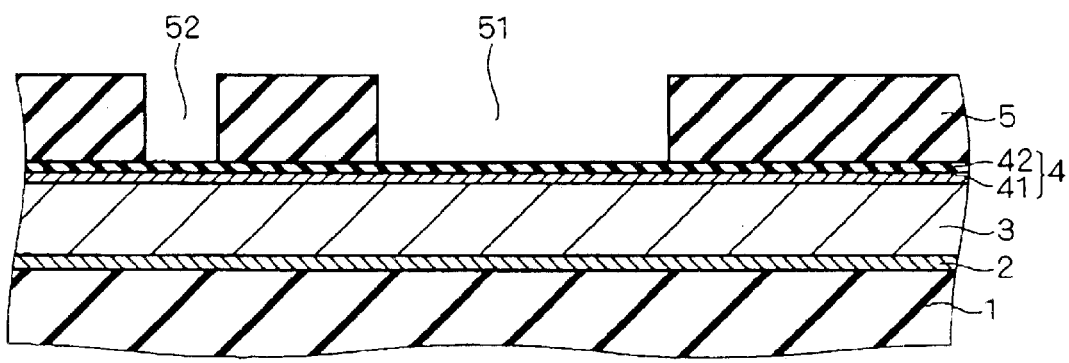
FIGS. 2 through 4 are diagrams showing the manufacturing process of the semiconductor device according to the preferred embodiment.

Then, the second interlayer insulation film 5 is formed on the antireflection film 4. As shown in FIG. 2, openings 51 and 52 are formed respectively in a region of the second interlayer insulation film 5 where the MIM capacitor element is formed (or the upper electrode 81 is formed) and in a region of the second interlayer insulation film 5 where the contact plug 82 is formed. At this time, the antireflection film 4 (SiON layer 42) exposed in the openings 51 and 52 is not removed.

Figure 3:
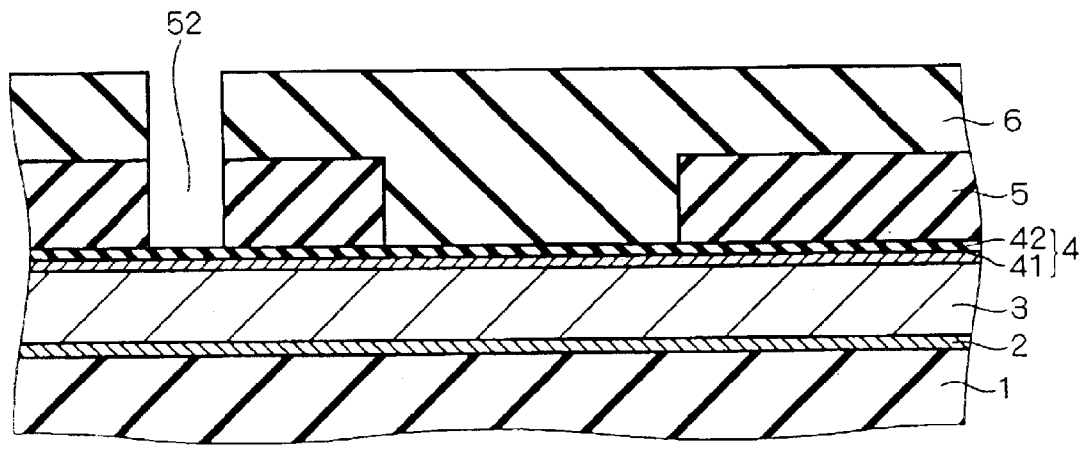

Then, as shown in FIG. 3, a photoresist 6 having an opening above the opening 52 (above the region where the contact plug 82 is formed) is formed on the second interlayer insulation film 5. Using the photoresist 6 as a mask, the antireflection film 4 is removed. That is, the antireflection film 4 in the opening 52 is removed while leaving the antireflection film 4 in the opening 51.

Figure 4:
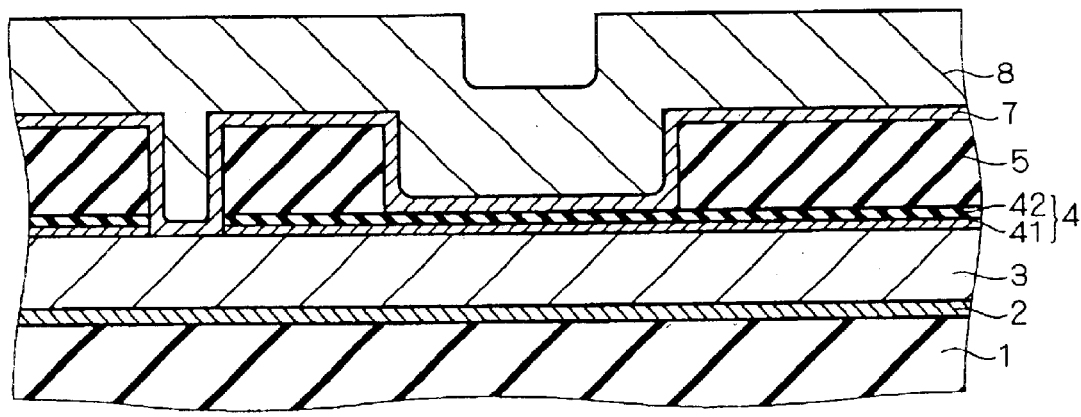

After removal of the photoresist 6, as shown in FIG. 4, a barrier metal 7 is deposited on the second interlayer insulation film 5 and a tungsten film 8 for forming the upper electrode 81 and the contact plug 82 is deposited. Then, the tungsten film 8 other than that in the openings 51 and 52 is removed to form the upper electrode 81 in the opening 51 and the contact plug 82 in the opening 52. Then, the barrier metal 9 and an aluminum film are deposited and patterned to form the second aluminum interconnect line 10 which is individually connected to the upper electrode 81 and the contact plug 82. This results in the formation of the semiconductor device structure shown in FIG. 1.

As is evident from the above description, the contact plug 82 which is electrically connected to the first aluminum interconnect line 3 as the lower electrode is formed by the same process as and in parallel with the upper electrode 81. Also as shown in FIG. 1, since the upper surfaces of the upper electrode 81 and the contact plug 82 are at the same level, an electrical contact can be easily provided between the second aluminum interconnect line 10 and each of the upper electrode 81 and the lower electrode (first aluminum interconnect line 3). That is, the problem of difficulty in forming a contact due to a difference in the levels of the upper and lower electrodes as in a conventional MIM capacitor element can be prevented. Further, since the antireflection film 4 used for forming the first aluminum interconnect line 3 is utilized as the dielectric layer of the MIM capacitor element, the manufacturing process can be simplified.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising:

(a) forming a first interlayer insulation film on a semiconductor substrate;

(b) depositing a first metal film on said first interlayer insulation film;

(c) depositing an antireflection film including a dielectric layer on an upper surface of said first metal film;

(d) patterning said first metal film and said antireflection film to form a lower electrode having said antireflection film on an upper surface thereof;

(e) forming a second interlayer insulation film on said antireflection film;

(f) forming first and second openings in a first region and in a second region in said second interlayer insulation film, respectively;

(g) removing a portion of said antireflection film where said second opening is formed;

(h) depositing a second metal film on said second interlayer insulation film; and (i) removing said second metal film except in said first and second openings to form an upper electrode in said first opening, and a contact in said second opening.

2. The method of manufacturing a semiconductor device according to claim 1, further comprising:

(j) depositing a third metal film on said second interlayer insulation film; and (k) patterning said third metal film to form an interconnect line including a first portion and a second portion, said first and second portions of the interconnect line being individually connected to said contact and said upper electrode, respectively, wherein said steps (j) and (k) are performed after said step (i).

* * * * *